(12) United States Patent
Otto et al.

(10) Patent No.: US 10,008,487 B2
(45) Date of Patent: Jun. 26, 2018

(54) OPTOELECTROIC SEMICONDUCTOR CHIP AND METHOD OF PRODUCING AN OPTOELECTRONIC SEMICONDUCTOR CHIP

(71) Applicant: OSRAM Opto Semiconductors GmbH, Regensburg (DE)

(72) Inventors: Isabel Otto, Regensburg (DE); Alexander F. Pfeuffer, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 6 days.

(21) Appl. No.: 15/304,917

(22) PCT Filed: Apr. 29, 2015

(86) PCT No.: PCT/EP2015/059407
§ 371 (c)(1),
(2) Date: Oct. 18, 2016

(87) PCT Pub. No.: WO2015/166001
PCT Pub. Date: Nov. 5, 2015

(65) Prior Publication Data
US 2017/0179091 A1 Jun. 22, 2017

(30) Foreign Application Priority Data
Apr. 29, 2014 (DE) .................. 10 2014 105 999

(51) Int. Cl.
*H01L 33/00* (2010.01)
*H01L 25/16* (2006.01)
(Continued)

(52) U.S. Cl.
CPC ............ *H01L 25/167* (2013.01); *H01L 25/50* (2013.01); *H01L 33/0079* (2013.01);
(Continued)

(58) Field of Classification Search
CPC .......................... H01L 33/0079; H01L 25/50
See application file for complete search history.

(56) References Cited

U.S. PATENT DOCUMENTS

| 2010/0314643 | A1 | 12/2010 | Lin |
| 2011/0127568 | A1* | 6/2011 | Donofrio ............. H01L 33/405 257/99 |
| 2014/0014894 | A1 | 1/2014 | Mohammed et al. |

FOREIGN PATENT DOCUMENTS

| DE | 10 2007 020 291 A1 | 8/2008 |
| DE | 10 2014 106 635 A1 | 11/2014 |
| DE | 10 2014 101 896 A1 | 8/2015 |

OTHER PUBLICATIONS

Dr. William Henry, "MicroLED Sources Enable Diverse Ultralow-Power Applications," Photonics Spectra, Oct. 2013, pp. 1-3.
(Continued)

*Primary Examiner* — Samuel Gebremariam
(74) *Attorney, Agent, or Firm* — DLA Piper LLP (US)

(57) ABSTRACT

An optoelectronic semiconductor chip includes a semiconductor layer sequence with an upper face and a lower face opposite the upper face, wherein the semiconductor layer sequence has an active layer that generates electromagnetic radiation, and a plurality of contact elements that electrically contact the semiconductor layer sequence arranged on the upper face, wherein the semiconductor chip is a thin-film semiconductor chip, the lower face is a radiation decoupling surface through which the radiation generated in the semiconductor layer sequence is decoupled, the contact elements can be electrically actuated individually and independently from one another, and the semiconductor layer sequence has a thickness of at most 3 μm.

20 Claims, 6 Drawing Sheets

(51) Int. Cl.
*H01L 33/08* (2010.01)
*H01L 33/40* (2010.01)
*H01L 25/00* (2006.01)
*H01L 33/62* (2010.01)
*H01L 27/12* (2006.01)

(52) U.S. Cl.
CPC ............ *H01L 33/08* (2013.01); *H01L 33/405* (2013.01); *H01L 33/62* (2013.01); *H01L 27/1214* (2013.01)

(56) References Cited

OTHER PUBLICATIONS

Masahiro Watanabe et al., "Over 1000 channel nitride-based micro-light-emitting diode arrays with tunnel junctions," Japanese Journal of Applied Physics, vol. 53, 2014, pp. 1-4.

* cited by examiner

| b/a [μm] | R (d=3 μm) | R (d=4 μm) | R (d=5 μm) | R (d=6 μm) | R (d=7 μm) | R (d=8 μm) |
|---|---|---|---|---|---|---|
| 5/5 | 1:33 | 1:17 | 1:11 | 1:6 | 1:6 | 1:5 |
| 8/2 | 1:9 | 1:7 | 1:5 | 1:5 | 1:4 | 1:4 |
| 10/10 | 1:152 | 1:106 | 1:71 | 1:45 | 1:22 | 1:17 |
| 15/5 | 1:30 | 1:23 | 1:16 | 1:12 | 1:10 | 1:7 |
| 18/2 | 1:16 | 1:12 | 1:9 | 1:8 | 1:7 | 1:6 |

| b/a [μm] | R (d=1 μm) | R (d=1.5 μm) | R (d=2 μm) |
|---|---|---|---|
| 5/5 | 1:156 | 1:119 | 1:78 |
| 8/2 | 1:32 | 1:19 | 1:13 |
| 10/10 | 1:146 | 1:90 | 1:48 |
| 15/5 | 1:1915 | 1:600 | 1:273 |
| 18/2 | 1:43 | 1:32 | 1:26 |

Fig. 5

| b/a [μm] | R (d=3 μm) | R (d=4 μm) | R (d=5 μm) | R (d=6 μm) | R (d=7 μm) | R (d=8 μm) |
|---|---|---|---|---|---|---|
| 5/5 | 1:203 | 1:145 | 1:114 | 1:101 | 1:87 | 1:71 |
| 8/2 | 1:97 | 1:75 | 1:54 | 1:43 | 1:28 | 1:24 |
| 10/10 | 1:1159 | 1:871 | 1:559 | 1:548 | 1:374 | 1:300 |
| 15/5 | 1:486 | 1:436 | 1:322 | 1:296 | 1:211 | 1:144 |
| 18/2 | 1:497 | 1:179 | 1:141 | 1:91 | 1:77 | 1:59 |

| b/a [μm] | R (d=1 μm) | R (d=1,5 μm) | R (d=2 μm) |
|---|---|---|---|
| 5/5 | 1:565 | 1:397 | 1:307 |
| 8/2 | 1:231 | 1:109 | 1:100 |
| 10/10 | 1:2510 | 1:4470 | 1:2450 |
| 15/5 | 1:824 | 1:709 | 1:1616 |
| 18/2 | 1:701 | 1:521 | 1:626 |

OPTOELECTROIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of producing an optoelectronic semiconductor chip.

BACKGROUND

There is a need for a semiconductor chip with a plurality of radiation-emitting pixels that delivers a high contrast ratio between neighboring pixels and a method of producing such a semiconductor chip, the method being particularly simple and cost-efficient.

SUMMARY

We provide an optoelectronic semiconductor chip including a semiconductor layer sequence with an upper face and a lower face opposite the upper face, wherein the semiconductor layer sequence has an active layer that generates electromagnetic radiation, and a plurality of contact elements that electrically contact the semiconductor layer sequence arranged on the upper face, wherein the semiconductor chip is a thin-film semiconductor chip, the lower face is a radiation decoupling surface through which the radiation generated in the semiconductor layer sequence is decoupled, the contact elements can be electrically actuated individually and independently from one another, and the semiconductor layer sequence has a thickness of at most 3 μm.

We also provide a method of producing an optoelectronic semiconductor chip including a) providing a growth substrate, b) growing a semiconductor layer sequence on the growth substrate, wherein the semiconductor layer sequence includes an active layer that generates electromagnetic radiation, c) forming a plurality of contact elements that can individually and independently be actuated on a side of the semiconductor layer sequence facing away from the growth substrate, wherein each contact element distinctly is assigned to a pixel, which appears luminous to an observer during operation, d) arranging a carrier on the contact elements, e) removing the growth substrate, and f) at least partially stripping the semiconductor layer sequence until a thickness of the semiconductor layer sequence is 3 μm maximum, by which an optical cross talk of neighboring pixels is reduced, and a defect density in the semiconductor layer, adjacent to the radiation decoupling face, is at most $5 \cdot 10^8$ cm$^{-2}$.

We further provide an optoelectronic semiconductor chip including a semiconductor layer sequence with an upper face and a lower face opposite the upper face, wherein the semiconductor layer sequence has an active layer that generates electromagnetic radiation, and a plurality of contact elements that electrically contact the semiconductor layer sequence arranged on the upper face, wherein the semiconductor chip is a thin-film semiconductor chip, the lower face is a radiation decoupling surface through which the radiation generated in the semiconductor layer sequence is decoupled, the contact elements can be electrically actuated individually and independently from one another, each contact element is assigned to a pixel that appears luminous to an observer during operation, and the semiconductor layer sequence has a thickness of at most 3 μm, by which an optical cross talk of neighboring pixels is reduced, and a defect density in the semiconductor layer, adjacent to the radiation decoupling face, is at most 5·108 cm-2.

BRIEF DESCRIPTION OF THE DRAWINGS

FIGS. 3A to 3D show plan views of various examples of a semiconductor chip described herein.

FIGS. 4 and 5 show tables of contrast ratios for simulated semiconductor chips.

Figure 1A:
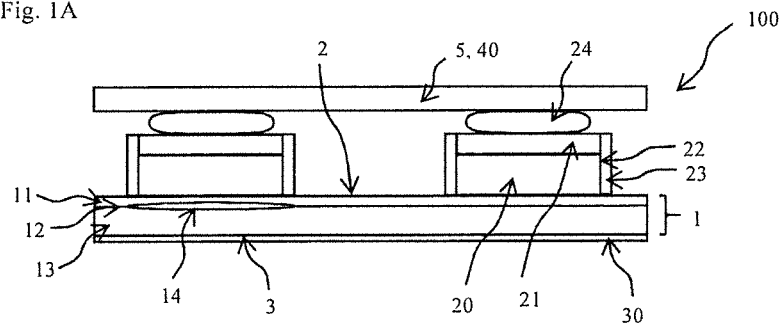
FIGS. 1A to 1C show schematic side views on examples of an optoelectronic semiconductor chip described herein.

LIST OF REFERENCE NUMERALS 1 semiconductor layer sequence
2 upper face
3 lower face
4 growth substrate
5 carrier
6 buffer layer sequence
11 p-doped layer
12 active layer
13 n-doped layer
14 active region
20 contact element
21 conductive protection layer
22 side surfaces of the contact element 20
23 insulation layer
24 solder material
30 further contact element
40 active matrix element
100 optoelectronic semiconductor chip

DETAILED DESCRIPTION

Our optoelectronic semiconductor chip may comprise a semiconductor layer sequence having an upper face and a lower face opposite the upper face.

The semiconductor layer sequence is preferably based upon a III-V semiconductor compound material. For example, the semiconductor material is a nitride semiconductor compound material such as $Al_nIn_{1-n-m}Ga_mN$, or a phosphide semiconductor compound material such as $Al_nIn_{1-n-m}Ga_mP$, or even an arsenide semiconductor compound material such as $Al_nIn_{1-n-m}Ga_mAs$, where $0 \leq n \leq 1$, $0 \leq m \leq 1$ and $n+m \leq 1$. In this case, the semiconductor layer sequence may comprise dopants as well as additional components. However, for the sake of simplicity, merely essential components of the crystal lattice of the semiconductor layer sequence, namely Al, As, Ga, In, N or P, are indicated even though they may in part be substituted and/or supplemented by small amounts of further substances. Preferably, the semiconductor layer sequence is based upon AlInGaN.

The semiconductor layer sequence comprises at least one active layer that generates electromagnetic radiation. The active layer particularly includes at least one p-n-junction and/or at least one quantum well structure. Radiation generated by the active layer during operation is particularly in the spectral range between 400 nm and 800 nm.

A plurality of contact elements may be applied to the upper face of the semiconductor layer sequence. For example, the contact elements comprise a metal such as aluminum or silver or gold or are composed of such a metal. The semiconductor layer sequence is electrically contacted for the intended operation via the contact elements. The contact elements may have a circular, quadratic rectangular or hexagonal design, for example.

The optoelectronic semiconductor chip may be a thin film semiconductor chip. Thus, in particular, the semiconductor chip is free from a growth substrate that the semiconductor layer sequence was grown on. Instead, the semiconductor chip comprises a carrier different from the growth substrate, for example, with the semiconductor layer sequence being applied to the carrier and the carrier mechanically stabilizing the semiconductor layer sequence. For example, the semiconductor chip becomes self-supporting by the carrier.

The carrier may further comprise a metal material or a ceramic material or consist of such a material. Further, it is possible for the carrier to be produced from a glass material or a plastic material or comprise at least one of the materials. The carrier may also comprise a semiconductor material such as silicon or germanium or be formed thereof. For example, the carrier contains electric circuits and/or is a printed circuit board.

The lower face of the semiconductor sequence may be a radiation decoupling surface. That is, radiation generated in the active layer of the semiconductor layer sequence is partially or entirely decoupled through the lower face from the semiconductor layer sequence.

Preferably, a carrier stabilizing the semiconductor chip is not applied to the lower face of the semiconductor layer sequence. The carrier stabilizing the semiconductor chip is thus preferably arranged on the upper face of the semiconductor layer sequence.

The contact elements attached to the upper face of the semiconductor layer sequence can be electrically actuated individually and independently from one another. That is, at least some, preferably all contact elements can be applied with an electric voltage individually and independently from the other contact elements.

If a contact element is electrically actuated, the active layer of the semiconductor layer sequence emits electromagnetic radiation preferably only in a region in close proximity of the contact element. The region is referred to as active region. Thus, preferably, one contact element can be clearly assigned to each active region and vice versa.

The contact elements may have a lateral extent parallel to the extension direction of the upper face of at most 50 µm, preferably at most 15 µm, particularly preferably at most 5 µm. Furthermore, the distance between two neighboring contact elements may be at most 20 µm, preferably at most 10 µm, particularly preferably at most 5 µm for at least a part of the contact elements.

In a plan view of the radiation decoupling surface, for example, the lateral extent of an active region, i.e., the extent parallel to the radiation decoupling surface, has a similar size as the lateral extent of the associated contact element. In particular, the active region may have a greater lateral extent than the associated contact element, for example, a lateral extent greater by at most 3 µm, preferably by at most 2 µm, particularly preferably by at most 1 µm, due to the laterally current-spreading effect to the semiconductor layer sequence.

The semiconductor layer sequence may have a thickness of at most 3 µm, preferably at most 2 µm, particularly preferably at most 1.5 µm. The thickness of a semiconductor layer sequence relates to the maximum, preferably the average thickness of the semiconductor layer sequence. The thickness may be defined as the distance between the upper face and the lower face of the semiconductor layer sequence.

The optoelectronic semiconductor chip may comprise a semiconductor layer sequence with an upper face and a lower face opposite the upper face. The semiconductor layer sequence comprises an active layer that generates electromagnetic radiation. A plurality of contact elements that electrically contact the semiconductor layer sequence is arranged in the upper face of the semiconductor layer sequence. The semiconductor chip is a thin film semiconductor chip. The lower face of the semiconductor layer sequence forms a radiation decoupling surface, through which the radiation generated in the semiconductor layer sequence is decoupled. The contact elements on the upper face of the semiconductor layer sequence can be individually and independently electrically actuated from one another. The semiconductor layer sequence has a thickness of at most 3 µm.

We provide a particularly simple semiconductor chip having a plurality of radiation-emitting pixels, among other things. To that end, a plurality of contact elements that can be actuated individually and independently from one another and having lateral extents of few microns, for example, are applied to a common semiconductor layer sequence. During operation, the active layer of the semiconductor layer sequence preferably generates electromagnetic radiation only in the active region in close proximity to the contact element. This way, a radiation-emitting active region of the active layer can be clearly assigned to each contact element. Each one of the active regions associated with a contact element appears to be a light-emitting pixel to an external observer during operation.

To achieve an advantageous contrast ratio between neighboring pixels, the semiconductor layer sequence is preferably of a particular thin design. As a result, fewer scattering and reflection processes occur within the semiconductor layer sequence for the radiation generated by the active layer. As a result, the active region assigned to a contact element advantageously has a greater lateral extent than the associated contact element per se by a few microns at most. This also enables predefining the pixel shape and size by the shape and size of the contact elements.

Advantageously, our chips dispense with pixels that are separated from one another using mesa trenches in the semiconductor layer sequence. Introduction of such mesa trenches and the possible filling of the mesa trenches with a reflective material such as silver requires comparatively great effort. However, due to the fact that a particularly thin semiconductor layer sequence is used, the required contrast ratio between neighboring pixels is achieved even without such mesa trenches.

The radiation decoupling surface of the semiconductor layer sequence may have a surface roughening with a roughness. The roughness is equal to or less than 200 nm, preferably equal to or less than 100 nm, particularly preferably equal to or less than 50 nm. Specifically, the radiation decoupling surface is smooth apart from the surface roughening. Thus, the roughness is very small, particularly preferably the radiation decoupling surface is smooth.

The term roughening of the surface relates to structures of a surface through which the surface receives a profile or a roughness. Roughness is a measure for the variation of the surface height of the corresponding surface caused by the structures. For example, only structures causing a slight variation in the surface height count among roughening of the surface. A "slight variation" is a variation that is small compared to the lateral extent of the contact elements, for example, at most 1/10 or 1/20 or 1/100 the size of the lateral extent of the contact elements. This makes it possible to differentiate between the roughness of a surface, which often times is undesired and hardly controllable, from structures that were introduced intentionally such as mesa trenches or mesa holes.

Roughness may be the average roughness, i.e., the roughness indicates the average distance of a measuring point on the surface to an average surface. Within a measurement area, the average surface intersects the actual profile of the surface such that the sum of the measured profile deviations with respect to the average surface becomes minimal. As an alternative, the roughness may also be the quadratic roughness, i.e., the mean quadratic profile deviation from the average surface, or the maximum roughness, i.e., the maximum measured profile deviation from the average surface.

In semiconductor chips, the radiation decoupling surface is usually intentionally provided with a structuring or a roughening, with the radiation generated in the semiconductor layer sequence being scattered on the structure or roughening. This increases the decoupling efficiency of the radiation emitted from the semiconductor layer sequence. In the example described herein, the roughness of the roughening is kept at a low level, if possible, thereby reducing the scattering of the generated radiation on the radiation decoupling surface. Advantageously, it is thus achieved that any light-emitting pixel actually appears to an external observer as having approximately the size of the associated contact element or the associated active region, respectively. A smearing of the pixel or an overlapping of neighboring pixels, respectively, is reduced by the slight scattering on the radiation decoupling surface, which in turn increases the contrast ratio between neighboring pixels.

The semiconductor layer sequence has a continuous design and is free of recesses along the entire lateral extent of the semiconductor chip. In particular, structures such as trenches or holes are not introduced or intentionally introduced on the upper face and/or the lower face of the semiconductor layer sequence. For example, the upper face and/or the lower face are smooth except for the above mentioned roughening. For example, the semiconductor layer sequence then forms a continuous layer without interruptions. The thickness of the semiconductor layer sequence may, for example, be constant, for example, having maximum thickness fluctuation of at most 10% or 5% or 1% or 0.1%. Preferably, the active layer is designed continuously and without interruptions along the entire lateral extent of the semiconductor chip.

In the semiconductor layer sequence of this example, in particular, mesa trenches or mesa holes between two neighboring contact elements or between two neighboring active regions can be omitted.

Trenches such as mesa trenches may be intentionally introduced in the semiconductor layer sequence. The trenches extend, for example, from the upper face in the direction of the lower face. Preferably, the trenches are arranged laterally next to, specifically between the contact elements. For example, in a plan view of the upper face, each contact element is partially or entirely surrounded by a trench. The trench may run around the corresponding contact element in a continuous and interruption-free manner. Preferably, in a plan view, the trenches form individual closed or partially open meshes, with each contact element being surrounded by a clearly assigned mesh. Specifically, it is possible that all trenches are designed continuously so that a mesh of trenches is formed around the contact elements.

The trenches may penetrate through the active layer and comprise bottom surfaces in the region of the semiconductor layer sequence that is located between the active layer and the lower face.

The contact elements are arranged on the upper face of the semiconductor layer sequence in the type of a matrix. This can mean that the contact elements are arranged on the upper face in a regular pattern, for example, in the shape of a grid that may be further designed as a quadratic, rectangular or hexagonal grid.

By such an arrangement in the type of a matrix, specifically in the type of a grid, the individual contact elements can represent pixels of a display, for example, so that the semiconductor chip forms a micro display.

A potting material may be introduced in the region laterally to the contact elements, the potting material partially or entirely filling the interspaces between the contact elements. For example, the potting material may terminate flush with the contact elements in the direction away from the semiconductor layer sequence. The potting material and the contact elements then form a level and planar surface on a side facing away from the semiconductor layer sequence, for example. For example, the potting material has a reflectivity for the radiation emitted by the semiconductor layer sequence of at least 80%, wherein the reflectivity may be an averaged reflectivity averaged over the wavelength spectrum emitted by the semiconductor chip. As an alternative, the reflectivity may also be indicated at a wavelength where an intensity maximum occurs in the radiation emitted by the semiconductor chip. For example, the potting material is a basic material such as silicone or resin or synthetic material filled with reflecting particles such as $TiO_2$.

A common active matrix element may be applied to a plurality of the contact elements on the upper face of the semiconductor layer sequence, specifically to all contact elements. The active matrix element serves for selective electrical actuating the individual contact elements. The active matrix element may be a plurality of transistors, for example, such as thin film transistors having the same arrangement of the contact elements, preferably in the type of a matrix. The transistors may be applied to a substrate, e.g., a glass substrate or a semiconductor substrate, or on a printed circuit board, for example. One contact element and thus one pixel of the semiconductor layer sequence is clearly assigned to each transistor. Further, current supply connections are clearly assigned to each pixel on the active matrix element, for example.

With such an active matrix element, the semiconductor chip may, for example, be used as a micro display, with the active matrix element ensuring that each contact element or pixel of the micro display can be individually actuated.

The contact elements may comprise or consist of a mirroring material. The mirroring material may be silver, aluminum or gold or a metal alloy of the materials. Light decoupling efficiency of the semiconductor chip is increased by mirroring contact elements.

A further contact element may be attached to the radiation decoupling surface of the semiconductor layer sequence to electrically contact the semiconductor layer sequence. In this case, the semiconductor layer sequence is arranged between the contact elements and the further contact element and is supplied with current via the contact elements and the further contact element. Preferably, the further contact element comprises or consists of an electrically conductive transparent material, for example, a transparent conductive oxide, TCO for short such as indium tin oxide, ITO for short, or fluorine tin oxide or aluminum zinc oxide.

Alternatively or additionally, it is possible that the further contact element comprises a metal grid for electric contacting. The further contact element may partially or entirely cover the radiation decoupling surface.

The further contact element may run continuously and without interruptions on the radiation decoupling surface. Preferably, the further contact element partially or entirely covers multiple, specifically all contact elements in a plan view of the radiation decoupling surface. The thickness of the further contact element, measured transversely to the radiation decoupling surface, is at least 50 nm or 100 nm or 300 nm, for example. Alternatively, or additionally, the thickness is at most 5 µm or 1 µm or 500 nm. Preferably, the further contact element does not form a stabilizing component in the semiconductor chip. In particular, the further contact element is mechanically not self-supporting. Particularly preferably, a further layer, in particular a carrier, is not applied to the side of the further contact element facing away from the radiation decoupling surface. An additional or alternative option is that the further contact element is arranged on the edge of the semiconductor chip. In particular, the further contact element is in direct contact to a highly doped layer of the semiconductor layer sequence, where the highly doped layer of the semiconductor layer sequence serves as a current spreading layer distributing the current fed by the further contact element over the entire lateral extent of the semiconductor chip.

Alternatively, the further contact element is arranged in the trenches of the semiconductor layer sequence. The further contact element may run continuously and without interruption even within the trenches. For example, the further contact element reproduces the mesh structure or grid structure of the trenches. The further contact element may be in direct electric contact to the semiconductor layer sequence, particularly in the region of the bottom faces of the trenches. This way, the entire current supply of the semiconductor chip can be effected from a side of the semiconductor layer sequence facing away from the radiation decoupling surface. In this case, it is particularly possible that the further contact element comprises or consists of a metal such as Ag or Al. The radiation decoupling surface is free from contact elements, for example. In particular, the radiation decoupling surface may be exposed along the entire semiconductor chip.

A conductive protection layer, e.g., of zinc oxide or titanium, may be formed on the side of the contact elements facing away from the semiconductor layer sequence.

The contact elements may comprise side surfaces running transversely to the upper face of the semiconductor layer sequence. Preferably, insulation layers, e.g., of silicon oxide such as $SiO_2$ or of silicon nitride such as SiN or of aluminum oxide such as $Al_2O_3$ are applied to the side surfaces of the contact elements.

The conductive protection layer and the insulation layers protect the contact elements from external influences such as penetration of moisture or of oxidation, for example. To that end, the conductive protection layer and/or the insulation layers are preferably applied to the exposed external surfaces of the contact elements, i.e., the external surfaces not covered by the semiconductor layer sequence, in a form-fit manner. Together with the semiconductor layer sequence, the conductive protection layer and the insulation layers completely encapsulate the contact elements.

Instead of the insulation layer or in addition to the layer, a protective conductive layer is as well possible on the side surfaces of the contact elements.

A semiconductor layer adjacent to the radiation decoupling surface may comprise defects, for example, grid dislocations. The defects develop, for example, when growing the semiconductor layer sequence on a growth substrate. Preferably, the defect density in the semiconductor layer adjacent to the radiation decoupling surface is at most $5 \cdot 10^8$ $cm^{-2}$, particularly preferably at most $3 \cdot 10^8$ $cm^{-2}$, particularly preferably $2 \cdot 10^8$ $cm^{-2}$.

We also provide a method of producing an optoelectronic semiconductor chip.

For example, the method is suitable for producing a semiconductor chip according to the examples above. Thus, features of the semiconductor chip are just as well disclosed for the method of producing a semiconductor chip and vice versa.

The method of producing an optoelectronic semiconductor chip may comprise a step a), in which a growth substrate is provided. The growth substrate may be a substrate such as a sapphire substrate suitable for growing a III-V-semiconductor layer sequence, for example.

In a step b) of the method, a semiconductor layer sequence, for example, based upon GaN or GaP or GaAs may be grown on the growth substrate. The semiconductor layer sequence comprises at least one active layer that generates electromagnetic radiation in proper use.

In a step c), a plurality of contact elements that can be individually and independently actuated from one another, may be formed on the side of the semiconductor layer sequence facing away from the growth substrate.

In a step d), a carrier may be applied to the sides of the contact elements facing away from the growth substrate. The carrier may be a metal carrier or a ceramic carrier or a semiconductor carrier or a printed circuit board or an active matrix element, for example. Specifically, the carrier may mechanically stabilize the semiconductor chip so that the finished semiconductor chip is self-supporting.

In a step e), the growth substrate may be removed from the semiconductor layer sequence. The removal can be effected by a laser lift-off process, for example. Structures may develop when removing the growth substrate specifically on the side of the semiconductor layer sequence facing the growth substrate.

In a further step f), the semiconductor layer sequence may be removed all the way until the maximum or average thickness of the semiconductor layer sequence is at most 3 µm, preferably at most 2 µm, particularly preferably at most 1 µm. Stripping the semiconductor layer sequence is preferably effected from the side of the semiconductor layer sequence originally facing the growth substrate. For example, stripping the semiconductor layer sequence may be effected by a wet-chemical process, for example, by etching by KOH or $H_3PO_4$, or by a dry-chemical process, using chlorine gas or argon, for example. The side of the semiconductor layer sequence subjected to the etching processes can specifically be provided with structures by the etching processes. The structures may serve as decoupling structures for the light generated by the semiconductor layer sequence, for example. Such decoupling structures produce a roughness of at least 500 nm, preferably at least 700 nm, particularly preferably at least 1 µm on the radiation decoupling surface, for example.

After partially stripping the semiconductor layer sequence, a radiation decoupling surface may be formed by polishing from the side of the semiconductor layer sequence facing away from the carrier. In the process of polishing, preferably, the structures on the radiation decoupling surface are removed, which are generated during the removal of method step f). After the polishing, a roughening remains on the radiation decoupling surface with a roughness of at most 200 nm, preferably at most 100 nm, particularly preferably at most 50 nm.

In step b) of the method, first, a buffer layer sequence may be applied to the growth substrate. Subsequently, the active layer is applied to the buffer layer sequence. The active layer can be directly applied to the buffer layer sequence. However, as an alternative, it is also possible that further semiconductor layers, e.g., doped semiconductor layers for current conduction, are grown prior to application of the active layer.

For example, the buffer layer sequence may comprise the same semiconductor compound type as the semiconductor layer sequence. In particular, the buffer layer sequence may comprise multiple layers of different composition, for example, of different dopant concentrations. The buffer layer sequence reduces defects during the growth process and balances different thermal expansion coefficients of the growth substrate and the semiconductor layer sequence. This reduces defect density in the semiconductor layer sequence.

In step f), the buffer layer sequence of the semiconductor layer sequence may be partially or completely removed. Generally, the buffer layer sequence is important only to the growth process of the semiconductor layer sequence. After removing the growth substrate, the buffer layer sequence no longer has an indispensable functionality and may thus be partially or completely removed to reduce the thickness of the semiconductor layer sequence.

In step b), the semiconductor layer sequence may not be deposited on the growth substrate by a metal-organic vapor phase epitaxy, MOVPE for short, but by a sputtering process. By sputtering processes, thin epitaxy layers can be produced with a low defect density. The buffer layer sequence required for the metal-organic vapor phase epitaxy may then be dispensed with. As a result, there is no need to strip off a buffer layer sequence in a further step to achieve a thin semiconductor layer sequence.

Hereinafter, an optoelectronic semiconductor chip described herein as well as a method of producing an optoelectronic semiconductor chip is described with reference to the drawings by examples. Like reference numerals indicate like elements in the figures. However, the size ratios involved are not to scale, individual elements may rather be illustrated in an exaggerated size for a better understanding.

FIG. 1A shows a side view of an example of an optoelectronic semiconductor chip 100. The semiconductor layer chip 100 comprises a semiconductor layer sequence 1 with an upper face 2 and an opposite lower face 3, the semiconductor layer sequence 1 being based upon GaN, for example. The semiconductor layer sequence 1 comprises a p-doped layer 11, an n-doped layer 13 and an active layer 12 arranged between the p-doped layer 11 and the n-doped layer 13, the active layer being provided for generating electromagnetic radiation. The semiconductor layer sequence 1 as well as the active layer 12 are continuous, without interruptions along the entire lateral extent of the semiconductor chip 100, parallel to the lower face 3.

A plurality of contact elements 20 is arranged on the upper face 2 of the semiconductor layer sequence 1. For example, the contact elements 20 are composed of silver, for example, and can preferably be actuated individually and independently from one another.

In the example of FIG. 1A, the left of the two contact elements 20 is supplied with current, while current does not flow through the right contact element 20. By the current flowing through the left contact element 20, the active layer 12 emits electromagnetic radiation in close proximity to the left contact element 20 within the active region 14. For example, the active region 14 has a lateral extent greater than the associated contact element 20 by 1 μm maximum. The active region 14 forms a light-emitting pixel for an external observer in a plan view on the lower face 3, the pixel having a similar lateral extent and a similar shape as the contact element 20 supplied with current. By the plurality of contact elements 20 arranged on the upper face 2, which can be supplied with current independently from one another, a pixelated micro display is realized, for example.

The contact elements have a lateral extent parallel to the upper face 2 of the semiconductor layer sequence 1 of 10 μm, for example. The distance between two neighboring contact elements is also 10 μm, for example. The thickness of the semiconductor layer sequence 1 is 2 μm, for example.

In the example of FIG. 1A, radiation generated in the active layer is decoupled from the semiconductor layer sequence 1 via the lower face 3, which is a radiation decoupling surface 3. The radiation decoupling surface 3 has a roughening with a roughness substantially lower than the lateral extents of the contact elements 20. In this example, the roughness is at most 100 nm, for example. Thus, the roughening is small enough for the radiation decoupling surface 3 to appear smooth.

A further contact element 30 is applied to the radiation decoupling surface 3 for electric contacting, the semiconductor layer sequence 1 being supplied with current by the further contact element 30 and the contact elements 20. The further contact element 30 covers the entire radiation decoupling surface 3 of the semiconductor layer sequence 1. So that electromagnetic radiation may nonetheless be emitted via the radiation decoupling surface 3, the further contact element 30 is formed of a transparent conductive oxide such as indium tin oxide (ITO), for example.

In FIG. 1A, an electrically conductive layer 21 is applied to the sides of the contact elements 20 facing away from the semiconductor layer sequence 1, the layer 21 comprising titanium, for example. Furthermore, the contact elements 20 have side surfaces 22 running transversally to the upper face 2 of the semiconductor layer sequence 1. Insulation layers 23, e.g., of silicon oxide, are applied to the side surfaces 22 of the contact elements 20. The insulation layers 23 also cover side surfaces of the electrically conductive layer 21.

The electrically conductive layer 21 and the insulation layer 23 are applied to external faces of the contact elements 20 in a form-fit manner so that the electrically conductive layers 21 and the insulation layers 23 encapsulate the contact elements 20. The contact elements 20 are thereby protected from penetration of moisture and from oxidation, for example.

In FIG. 1A, a carrier 5, for example, an active matrix element 40, is applied to the plurality of contact elements 20, which element 40 allows electrically actuating the individual contact elements 20 independently from the remaining contact elements 20. To that end, the active matrix element 40 has a plurality of transistors and current supply connections. The active matrix element 40 connects to the contact elements 20 in an electrically conductive manner, preferably via a solder material 24.

Figure 1B:
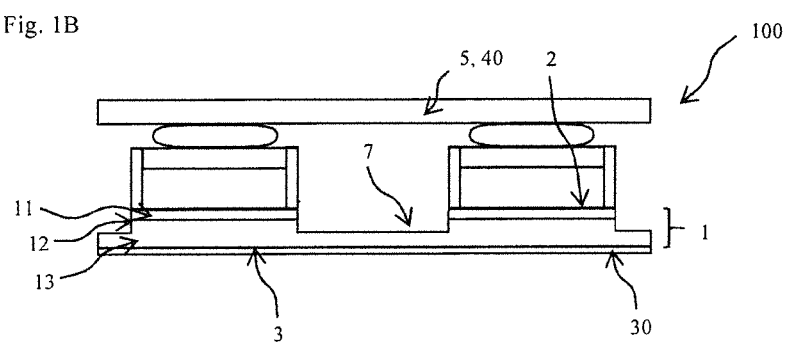

The example of FIG. 1B shows a similar example as illustrated in FIG. 1A. The only difference is that in FIG. 1A the thickness of the semiconductor layer sequence 1 is approximately constant and that it does not comprise intentionally introduced recesses such as mesa trenches, on the upper face 2.

In contrast, in FIG. 1B, trenches 7 are intentionally introduced between two neighboring contact elements 20. The depth of the trenches 7 is selected such that the trenches 7 penetrate the active layer 12 and terminate with bottom faces in the n-doped layer 13. The width of the trenches 7 is selected such that the trenches 7 extend from one contact element 20 to the next neighboring contact element 20. The regions between the contact elements 20, in particular the trenches 7, can optionally be filled with a potting material such as a white synthetic material.

Figure 1C:
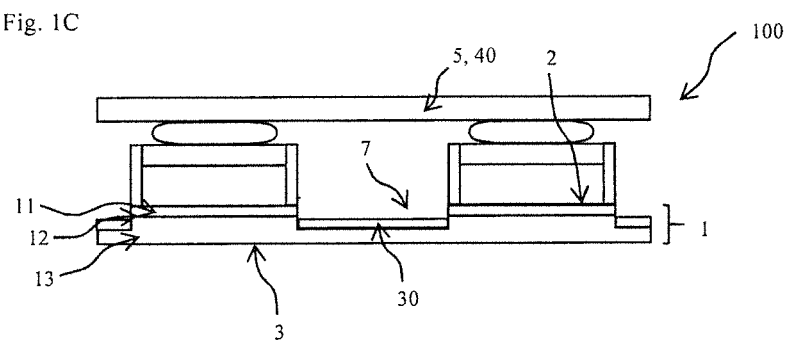

In the example of FIG. 1C, in contrast to FIG. 1B, the further contact element 30 is not attached to the radiation decoupling surface 3, but in the region of bottom faces of the trenches 7. In the regions, the further contact element 30 directly electrically contacts the n-doped layer 13, for example. In the semiconductor chip 100 of FIG. 1C, the entire semiconductor layer sequence 1 is thus supplied with current or contacted from a side facing away from the radiation decoupling surface 3. The radiation decoupling surface 3 is exposed along the entire lateral extent of the semiconductor chip 100.

Figure 1D:
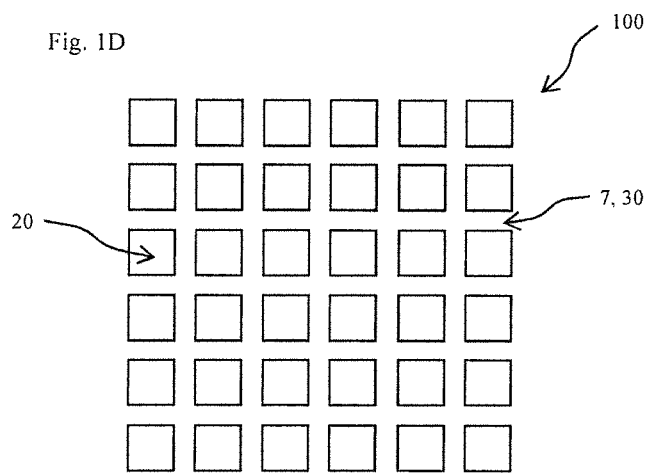
FIGS. 1D and 1E show schematic plan views on examples of an optoelectronic semiconductor chip described herein.

FIG. 1D shows an example of an optoelectronic semiconductor chip 100 in a plan view of the upper face 2. The contact elements 20 are arranged on grid points of a rectangular grid in the type of a matrix, i.e., in particular in a uniform manner. The contact elements 20 per se also have a rectangular basic shape, respectively. For example, the regions between the contact elements 20 may be formed by trenches 7, which form a grid around the contact elements 20, wherein each contact element 20 is clearly assigned to a mesh of the grid. The trenches 7 have a continuous design. For example, the further contact element 30 is arranged within the trenches 7. The further contact element 30 may reproduce the grid of the trenches 7, i.e., specifically extend in a continuous manner without interruptions within the trenches 7. The further contact element 30 in FIG. 1D is in one piece, for example.

Figure 1E:
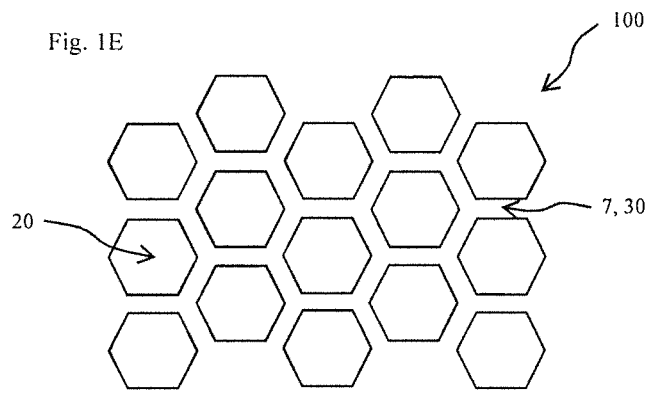

In turn, FIG. 1E shows a plan view on an example of a semiconductor chip 100. In contrast to FIG. 1D, the contact elements 20 now have hexagonal basic shapes. The contact elements 20 are arranged in the type of a matrix on grid points of a honeycomb grid.

Figure 2A:
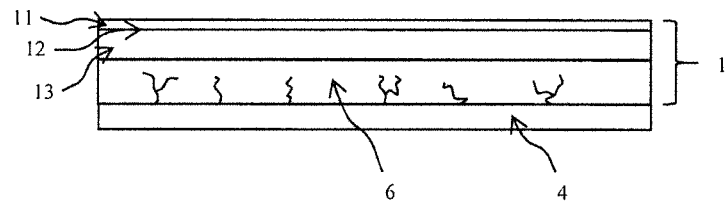
FIGS. 2A to 2F show schematic side views of examples of producing an optoelectronic semiconductor chip.

The example of FIG. 2A shows a step of a method of producing a semiconductor chip 100. To that end, a buffer layer sequence 6 is grown on a growth substrate 4, which in this case is formed of sapphire, for example. The buffer layer sequence 6 is based upon GaN, for example. Defects develop within the buffer layer sequence 6, for example, in the type of grid dislocations, between the buffer layer sequence 6 and the growth substrate 4 by the different thermal expansion coefficients and the different crystal properties of GaN and sapphire. The defect density decreases along with an increasing distance to the growth substrate 4.

Furthermore, an n-doped semiconductor layer 13 is applied to the side of the buffer layer sequence 6 facing away from the growth substrate 4. A p-doped layer 11 is applied to the n-doped layer 13. An active layer 12 provided for generation of radiation is formed between the p-doped layer 11 and the n-doped layer 13. The buffer layer sequence 6, the n-doper layer 13, the active layer 12 and the p-doped layer 11 together form a semiconductor layer sequence 1.

Figure 2B:
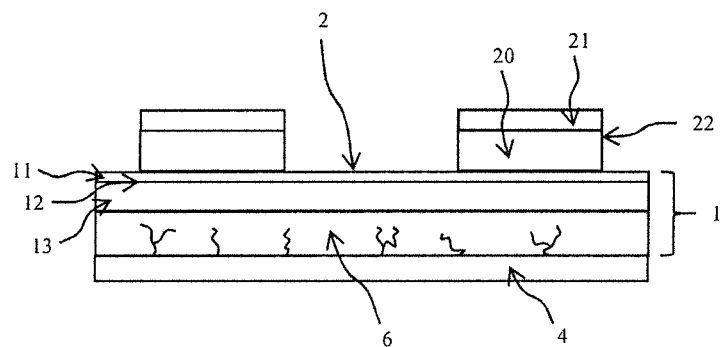

The example of FIG. 2B shows a method step in which contact elements 20 are applied to an upper face 2 of the semiconductor layer sequence 1 facing away from the growth substrate 4. For example, the contact elements 20 are formed of silver. In FIG. 2B, furthermore an electrically conductive layer 21, for example, of titanium is applied to the sides of the contact elements 20 facing away from the semiconductor layer sequence 1.

To produce the contact elements 20 with the conductive layers 21 applied thereon, a first metal layer is applied all over the upper face 2 of the semiconductor layer sequence 1. Then, the electrically conductive layer 21 is applied to the metal layer. The individual contact elements 20 with the electrically conductive layers 21 can then be produced by a structured etching method using a mask.

Figure 2C:
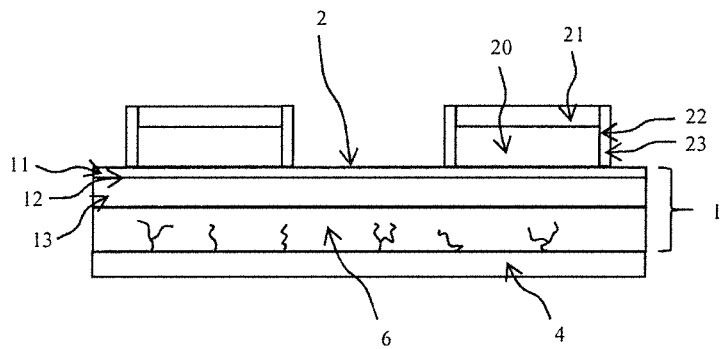

The example of FIG. 2C shows a method step in which an insulation layer 23, for example, of silicon oxide is applied to side surfaces 22 of the contact elements 20.

Figure 2D:
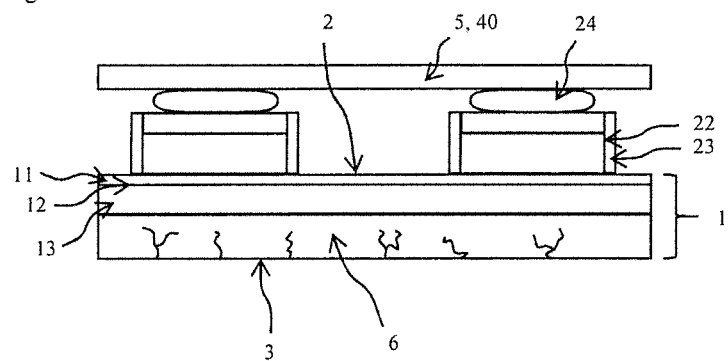

In the method step of FIG. 2D, a carrier 5, for example, in the type of an active matrix element 40 is arranged on the side of the contact elements 20 facing away from the semiconductor layer sequence 1 using a solder material 24. The active matrix element 40 covers a plurality of contact elements 20.

Further, in the example of FIG. 2D, the growth substrate 4 is removed, thereby exposing a lower face 3 of the semiconductor layer sequence 1. Removal of the growth substrate 4 may be effected by a laser lift-off process, for example. After removal of the growth substrate 4, the later semiconductor chip 100 is mechanically stabilized by the carrier 5, for example, and has a self-supporting design.

Figure 2E:
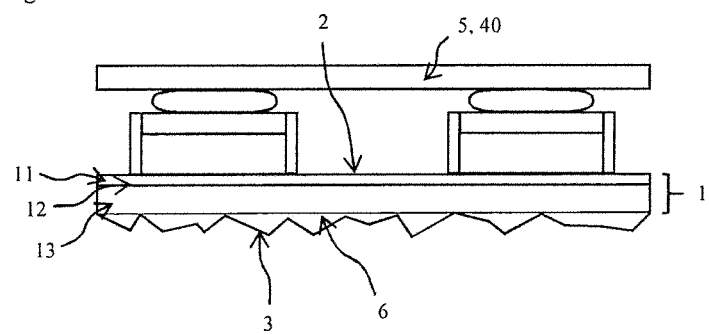

In the method step of FIG. 2E, the semiconductor layer sequence 1 is removed from the lower face 3 by a wet-chemical or dry-chemical etching process. Structures that may serve as decoupling structures for the electromagnetic radiation generated in the active layer 12 develop by the removal on the lower face 3 of the semiconductor layer sequence 1. In this example, the semiconductor layer sequence 1 is removed all the way until the thickness of the semiconductor layer sequence is at most 2 μm. To that end, the entire buffer layer sequence 6 is removed, for example.

Figure 2F:
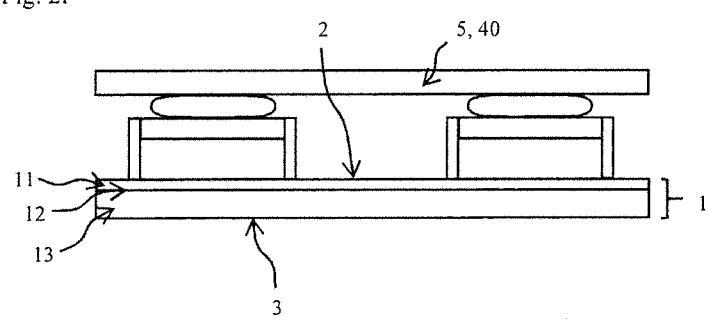

In the example of FIG. 2F, a further method step is shown in which a radiation decoupling surface 3 is generated from the lower face 3 by polishing the semiconductor layer sequence 1 on the lower face 3. During the polishing process, the structures generated by the removal process are removed again. Now, the radiation decoupling surface 3 has a roughening with a low roughness only. In this example, the radiation decoupling surface 3 is formed by the n-doped layer 13.

For the examples illustrated in FIGS. 1 and 2, the order of the n-doped 13 and p-doped 11 semiconductor layer sequences between the upper face 2 and the lower face 3 can be reversed. Furthermore, in addition to or in place of the GaN-based semiconductor materials, also GaP and/or GaAs may be used.

Figures 3, 4:
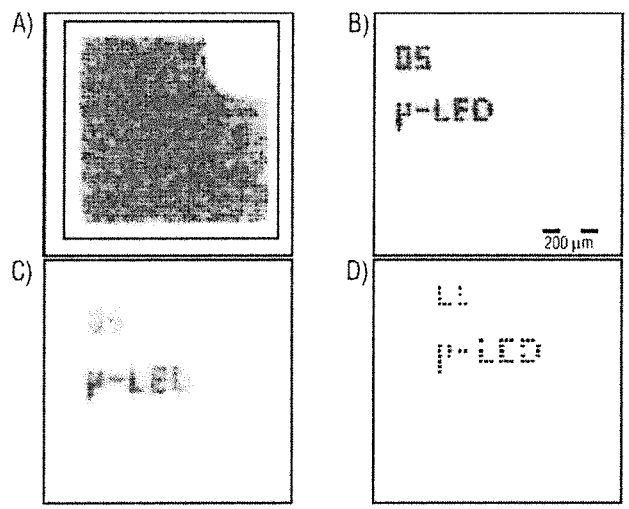

The example of FIG. 3 shows an optoelectronic semiconductor chip in a plan view on the radiation decoupling surface 3. In FIG. 3A, all contact elements 20 of the semiconductor chip 100 are supplied with current so that the entire radiation decoupling surface 3 of the semiconductor chip 100 illuminates. The semiconductor chip has a side length of at most 10 mm and comprises at least 100,000 pixels, for example.

In FIGS. 3B and 3D, only some of the contact elements of the semiconductor chip 100 are supplied with current and appear as a writing to the observer in which the individual pixels are clearly discernable. In the example of FIGS. 3B and 3D, the layer thickness of the semiconductor layer sequence is selected to be 7 μm. Moreover, the radiation decoupling surface is almost free of rougheings, i.e., the radiation decoupling surface is smooth. The roughness is at most 50 nm, for example. The difference between FIGS. 3B and 3D only lies with the recording method of the displays illustrated.

FIG. 3C shows a similar image as FIGS. 3B and 3D. The layer thickness of the semiconductor layer sequence is selected to be 7 µm. Furthermore, in FIG. 3C, the radiation decoupling surface 3 is provided with a roughening, the roughness of the roughening being greater than 500 nm. The roughening results in the pixels of FIG. 3C being optically discernable from one another in a poorer manner than in FIGS. 3B and 3D.

FIGS. 4 and 5 list simulated contrast ratios R of semiconductor chips provided herein. As used herein, the contrast ratio R relates to the ratio of the light intensity of an active pixel, i.e., a pixel being supplied with a current, to a light intensity of a neighboring switched-off pixel, i.e., a pixel not being supplied with a current. The contrast ratio R is listed in the tables of FIGS. 4 and 5 for various pixel widths b, i.e., for different widths b of the contact elements 20, as well as for different distances a between the contact elements 20. The widths b and the distances a are indicated in µm, respectively. Further, the contrast ratio R for certain thicknesses d of the semiconductor layer sequence 1 is specified. The table of FIG. 4 is different from the table of FIG. 5 in that the table of FIG. 4 lists values for semiconductor chips 100 having a coarsely roughened radiation decoupling surface 3, while the values in the table of FIG. 5 relate to semiconductor chips 100 having a radiation decoupling surface 3 which is polished and which therefore does not have any roughness.

The chips and methods described herein are not limited by the description in conjunction with the examples. This disclosure rather comprises any new feature as well as any combination of features, particularly including any combination of features in the appended claims, even if the feature or the combination per se is not explicitly stated in the claims or examples.

This application claims priority of DE 10 2004 105 999.9, the subject matter of which is incorporated herein by reference.

The invention claimed is:

1. An optoelectronic semiconductor chip comprising:
a semiconductor layer sequence with an upper face and a lower face opposite the upper face, wherein the semiconductor layer sequence has an active layer that generates electromagnetic radiation, and
a plurality of contact elements that electrically contact the semiconductor layer sequence arranged on the upper face, wherein
the semiconductor chip is a thin-film semiconductor chip,
the lower face is a radiation decoupling surface through which the radiation generated in the semiconductor layer sequence is decoupled,
the contact elements can be electrically actuated individually and independently from one another, and
the semiconductor layer sequence has a thickness of at most 3 µm.

2. The optoelectronic semiconductor chip according to claim 1, wherein the radiation decoupling surface has a roughening with a roughness, said roughness being equal to or less than 200 nm.

3. The optoelectronic semiconductor chip according to claim 1, wherein the semiconductor layer sequence is continuous and free of recesses.

4. The optoelectronic semiconductor chip according to claim 1, wherein trenches are introduced in the semiconductor layer sequence,
the trenches extend from the upper face in the direction of the lower face, and
each contact element is partially or entirely surrounded by a trench in a plan view of the upper face.

5. The optoelectronic semiconductor chip according to claim 1, wherein the contact elements have a lateral extent parallel to the extension direction of the upper face of at most 50 µm, and the distance of two neighboring contact elements is at most 20 µm, respectively.

6. The optoelectronic semiconductor chip according to claim 1, wherein the contact elements are arranged on the upper side of the semiconductor layer sequence in a matrix.

7. The optoelectronic semiconductor chip according to claim 1, wherein a common active matrix element is applied to a plurality of the contact elements, said active matrix element selectively electrically actuating the individual contact elements.

8. The optoelectronic semiconductor chip according to claim 1, wherein the contact elements comprise or consist of a mirroring material.

9. The optoelectronic semiconductor chip according to claim 1, wherein a further contact element that electrically contacts the semiconductor layer sequence is applied to the radiation decoupling surface, and the further contact element comprises or consists of an electrically conductive, transparent material and/or comprises a metal grid.

10. The optoelectronic semiconductor chip according to claim 1, wherein
a further contact element that electrically contacts the semiconductor layer sequence is arranged in the trenches, and
the radiation decoupling surface is free of contact elements.

11. The optoelectronic semiconductor chip according to claim 1, wherein a conductive protection layer is applied to sides of the contact elements facing away from the semiconductor layer sequence.

12. The optoelectronic semiconductor chip according to claim 1, wherein the contact elements have side surfaces running transversely to the upper face of the semiconductor layer sequence, and an insulation layer is applied to the side surfaces.

13. The optoelectronic semiconductor chip according to claim 1, wherein a defect density on a semiconductor layer adjoining the radiation decoupling surface is at most $5 \cdot 10^8$ cm$^{-2}$.

14. A method of producing an optoelectronic semiconductor chip comprising:
a) providing a growth substrate;
b) growing a semiconductor layer sequence on the growth substrate, wherein the semiconductor layer sequence comprises an active layer that generates electromagnetic radiation;
c) forming a plurality of contact elements that can individually and independently be actuated on a side of the semiconductor layer sequence facing away from the growth substrate, wherein
each contact element distinctly is assigned to a pixel, which appears luminous to an observer during operation;
d) arranging a carrier on the contact elements;
e) removing the growth substrate; and
at least partially stripping the semiconductor layer sequence until a thickness of the semiconductor layer sequence is 3 µm maximum, by which an optical cross talk of neighboring pixels is reduced, and a defect density in the semiconductor layer, adjacent to the radiation decoupling face, is at most $5 \cdot 10^8$ cm$^2$.

15. The method according to claim 14, wherein after stripping a radiation decoupling surface of the semiconductor layer sequence is formed by polishing so that a roughening of the radiation decoupling surface develops with a roughness of at most 200 nm.

16. The method according to claim 14, wherein, in b), first a buffer layer sequence is applied to the growth substrate, on which the active layer is grown.

17. The method according to claim 16, wherein, in f), the buffer layer sequence is partially or entirely removed.

18. The method according to claim 14, wherein the semiconductor layer sequence is applied to the growth substrate by a sputtering process.

19. An optoelectronic semiconductor chip comprising:
a semiconductor layer sequence with an upper face and a lower face opposite the upper face, wherein the semiconductor layer sequence has an active layer that generates electromagnetic radiation; and
a plurality of contact elements that electrically contact the semiconductor layer sequence arranged on the upper face, wherein
the semiconductor chip is a thin-film semiconductor chip,
the lower face is a radiation decoupling surface through which the radiation generated in the semiconductor layer sequence is decoupled,
the contact elements can be electrically actuated individually and independently from one another,
each contact element is assigned to a pixel that appears luminous to an observer during operation, and
the semiconductor layer sequence has a thickness of at most 3 μm, by which an optical cross talk of neighboring pixels is reduced, and a defect density in the semiconductor layer, adjacent to the radiation decoupling face, is at most $5 \cdot 10^8$ cm$^2$.

20. An optoelectronic semiconductor chip comprising:
a semiconductor layer sequence with an upper face and a lower face opposite the upper face, wherein the semiconductor layer sequence has an active layer that generates electromagnetic radiation,
a plurality of contact elements that electrically contact the semiconductor layer sequence arranged on the upper face, and
a plurality of pixels that emit radiation when operated, wherein
the semiconductor chip is a thin-film semiconductor chip,
the lower face is a radiation decoupling surface through which the radiation generated in the semiconductor layer sequence is decoupled,
the contact elements can be electrically actuated individually and independently from one another,
each contact element is assigned to a pixel, and
the semiconductor layer sequence has a thickness of at most 3 μm.

* * * * *

UNITED STATES PATENT AND TRADEMARK OFFICE
CERTIFICATE OF CORRECTION

PATENT NO. : 10,008,487 B2
APPLICATION NO. : 15/304917
DATED : June 26, 2018
INVENTOR(S) : Otto et al.

Page 1 of 1

It is certified that error appears in the above-identified patent and that said Letters Patent is hereby corrected as shown below:

In the Claims

Column 14,
Line 66, Claim 14 insert -- f) -- before "at least".

Column 15,
Line 3, Claim 14 change "$cm^2$" to -- $cm^{-2}$ --.

Column 16,
Line 9, Claim 19 change "$cm^2$" to -- $cm^{-2}$ --.

Signed and Sealed this
Eighteenth Day of September, 2018

Andrei Iancu
*Director of the United States Patent and Trademark Office*